(12) United States Patent
Bhattacharyya

(10) Patent No.: US 8,802,526 B2
(45) Date of Patent: Aug. 12, 2014

(54) METHODS OF FORMING REVERSE MODE NON-VOLATILE MEMORY CELL STRUCTURES

(75) Inventor: Arup Bhattacharyya, Essex Junction, VT (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 13/409,832

(22) Filed: Mar. 1, 2012

(65) Prior Publication Data

US 2012/0164804 A1 Jun. 28, 2012

Related U.S. Application Data

(62) Division of application No. 12/247,608, filed on Oct. 8, 2008, now Pat. No. 8,129,243, which is a division of application No. 11/131,006, filed on May 17, 2005, now Pat. No. 7,612,403.

(51) Int. Cl.
*H01L 21/336* (2006.01)

(52) U.S. Cl.
USPC .......... 438/258; 438/287; 438/288; 257/314; 257/315; 257/E21.423; 257/E29.309

(58) Field of Classification Search
USPC .......... 257/314–315, 324, E29.309, E21.423; 438/258, 287, 288
See application file for complete search history.

(56) References Cited

U.S. PATENT DOCUMENTS 6,054,734 A  4/2000 Aozasa et al.
(Continued)

FOREIGN PATENT DOCUMENTS

| EP | 0 016 246 A1 | 10/1980 |
| JP | 2003068893 | 3/2003 |
| JP | 2004336044 | 11/2004 |

OTHER PUBLICATIONS

C.L. Hinkle et al.; Enhanced Tunneling in Stacked Gate Dielectrics with Ultra-Thin $HfO_2$ ($ZrO_2$) Layers Sandwiched Between Thicker $SiO_2$ Layers; Sep. 20, 2004; Surface Science vol. 566-568; pp. 1185-1189.

P. Blomme et al.; Write/Erase Cycling Endurance of Memory Cells With $SiO_2$/$HfO_2$ Tunnel Dielectric; Sep. 2004; IEEE Transactions on Device and Materials Reliability vol. 4, No. 3; pp. 345-352.

(Continued)

*Primary Examiner* — Matthew W Such
*Assistant Examiner* — Ali Naraghi
(74) *Attorney, Agent, or Firm* — Dicke, Billig & Czaja, PLLC

(57) ABSTRACT

Methods of forming non-volatile memory cell structures are described that facilitate the use of band-gap engineered gate stacks with asymmetric tunnel barriers in reverse and normal mode floating node memory cells that allow for direct tunnel programming and erase, while maintaining high charge blocking barriers and deep carrier trapping sites for good charge retention. The low voltage direct tunneling program and erase capability reduces damage to the gate stack and the crystal lattice from high energy carriers, reducing write fatigue and enhancing device lifespan. The low voltage direct tunnel program and erase capability also enables size reduction through low voltage design and further device feature scaling. Such memory cells also allow multiple bit storage. These characteristics allow such memory cells to operate within the definition of a universal memory, capable of replacing both DRAM and ROM in a system.

19 Claims, 5 Drawing Sheets

(56) References Cited

U.S. PATENT DOCUMENTS

| | | | |
|---|---|---|---|
| 6,122,191 | A * | 9/2000 | Hirose et al. ............. 365/185.01 |
| 6,784,480 | B2 | 8/2004 | Bhattacharyya |
| 7,005,697 | B2 * | 2/2006 | Batra et al. ................... 257/315 |
| 7,158,420 | B2 | 1/2007 | Lung |
| 7,279,740 | B2 | 10/2007 | Bhattacharyya et al. |
| 7,402,850 | B2 | 7/2008 | Bhattacharyya |
| 7,829,938 | B2 | 11/2010 | Bhattacharyya |
| 7,851,827 | B2 | 12/2010 | Bhattacharyya |
| 2002/0190311 | A1 | 12/2002 | Blomme et al. |
| 2003/0033573 | A1 | 2/2003 | Tamura et al. |
| 2003/0042534 | A1 | 3/2003 | Bhattacharyya |
| 2003/0049900 | A1 | 3/2003 | Forbes et al. |
| 2003/0151948 | A1 | 8/2003 | Bhattacharyya |
| 2004/0123085 | A1 | 6/2004 | Oikawa et al. |
| 2004/0183122 | A1 | 9/2004 | Mine et al. |
| 2004/0251489 | A1 | 12/2004 | Jeon et al. |
| 2005/0023603 | A1 | 2/2005 | Eldridge et al. |
| 2005/0093054 | A1 | 5/2005 | Jung |
| 2005/0167734 | A1 | 8/2005 | She et al. |
| 2005/0237816 | A1 * | 10/2005 | Lue et al. ................. 365/185.28 |
| 2006/0281260 | A1 | 12/2006 | Lue |
| 2006/0284236 | A1 | 12/2006 | Bhattacharyya |

OTHER PUBLICATIONS

Hijiya et al.; High-Speed Write/Erase EAROM Cell with Graded Energy Band-Gap Insulator; Electronics and Communications in Japan, Part 2, vol. 68 No. 2; 1985; pp. 28-36.

C. Lee et al., A Novel SONOS Structure of $SiO_2/SiN/Al_2O_3$ with TaN metal gate for multi-giga bit flash memories, 2003, Samsung Electronics Co., Ltd., (pp. 26.5.1-26.5.4).

P. Blomme et al., Data retention of floating gate Flash memory with $SiO_2$/high-k tunnel or interpoly dielectric stack, 2004, Infineon Technologies.

S. Baik et al., High Speed and Nonvolatile Si Nanocrystal Memory for Scaled Flash Technology using Highly Field-Sensitive Tunnel Barrier, 2003, Samsung Electronics (pp. 23.3.1-22.3.4).

J. Buckley et al., Engineering of "Conduction Band—Crested Barriers" or "Dielectric Constant-Crested Barriers" in view of their application to floating-gate non-volatile memory devices, 2004, VLSI (pp. 55-56).

C. Lee et al., Operational and Reliability Comparison of Discrete-Storage Nonvolatile Memories: Advantages of Single-and Double-Layer Metal Nanocrystals, 2003, IEDM (pp. 22.6.1-22.6.4).

M. Takata et al., New Non-volatile Memory with Extremely High Density Metal Nano-Dots, 2003, IEDM, (pp. 22.5.1-22.5.4).

* cited by examiner

METHODS OF FORMING REVERSE MODE NON-VOLATILE MEMORY CELL STRUCTURES

RELATED APPLICATIONS

This Application is a Divisional of U.S. application Ser. No. 12/247,608, titled "METHODS OF FORMING NON-VOLATILE MEMORY HAVING TUNNEL INSULATOR OF INCREASING CONDUCTION BAND OFFSET," filed Oct. 8, 2008 now U.S. Pat. No. 8,129,243 (allowed), which is a Divisional of U.S. application Ser. No. 11/131,006, titled "NOVEL LOW POWER NON-VOLATILE MEMORY AND GATE STACK," filed May 17, 2005, now U.S. Pat. No. 7,612,403, each of which is commonly assigned and incorporated herein by reference.

TECHNICAL FIELD

The present invention relates generally to integrated circuits and in particular the present invention relates to non-volatile memory devices.

BACKGROUND

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM functions as a read and write memory; that is, you can both write data into RAM and read data from RAM. This is in contrast to read-only memory (ROM), which permits you only to read data. Most RAM, such as dynamic RAM (DRAM), static RAM (SRAM) and synchronous DRAM (SDRAM), is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM cannot be written to. An EEPROM (electrically erasable programmable read-only memory) is a special type non-volatile ROM that can be erased by exposing it to an electrical charge. EEPROM comprise a memory array which includes a large number of memory cells having electrically isolated gates. Data is stored in the memory cells in the form of charge on the floating gates or floating nodes associated with the gates. Each of the cells within an EEPROM memory array can be electrically programmed in a random basis by charging the floating node. The charge can also be randomly removed from the floating node by an erase operation. Charge is transported to or removed from the individual floating nodes by specialized programming and erase operations, respectively.

Yet another type of non-volatile memory is a Flash memory. A Flash memory is a type of EEPROM that is typically erased and reprogrammed in blocks instead of a single bit or one byte (8 or 9 bits) at a time. A typical Flash memory comprises a memory array, which includes a large number of memory cells. Each of the memory cells includes a floating gate field-effect transistor (FET) capable of holding a charge. The data in a cell is determined by the presence or absence of the charge in the floating gate/charge trapping layer. The cells are usually grouped into sections called "erase blocks." Each of the cells within an erase block can be electrically programmed in a random basis by charging the floating gate. The charge can be removed from the floating gate by a block erase operation, wherein all floating gate memory cells in the erase block are erased in a single operation.

The memory cells of both an EEPROM memory array and a Flash memory array are typically arranged into either a "NOR" architecture (each cell directly coupled to a bit line) or a "NAND" architecture (cells coupled into "strings" of cells, such that each cell is coupled indirectly to a bit line and requires activating the other cells of the string for access).

Floating gate memory cells are typically programmed by injecting electrons to the floating gate by channel hot carrier injection (CHE), placing the cell in a high threshold voltage state, and can be erased by hot hole injection from the substrate. Alternatively, floating gate memory cells can be programmed and erased by electron tunneling from and to the substrate by Fowler-Nordheim tunneling to put the cell in a programmed or erased threshold state. Both mechanisms require significant amounts of power and the generation of high positive and negative voltages in the memory device which can place high fields across the gate insulation layers with resulting adverse effects in device characteristics and reliability.

A problem with CHE, hot hole injection and Fowler-Nordheim tunneling is that the high energy required for their operation damages the device materials, reducing memory cell lifetimes and endurance. They can also consume large amounts of power, which is a problem in portable devices. In addition, the high voltages and fields limit the device feature scalability of the array and its support circuitry and significantly slow the write, read and erase speed of the resulting device. In particular, with Flash memory device types, CHE electron injection can generate interface states, degrade device transconductance, and enhance back-tunneling that affects charge retention and read-disturb. Fowler-Nordheim tunneling and hot hole injection can generate fixed charge centers in the tunneling insulators and shallow traps and defects in the trapping layer, thus breaking stable bonds and eventually degrading the insulator/dielectric properties of the device (limiting device endurance to a typical lifetime of less than $10^6$ program/erase cycles). Such high power, high voltage, slow access speed, limited endurance and scaling difficulties are a typical characteristic of most commonly utilized non-volatile memory devices.

An ideal or universal memory would combine the high speed, low power and effectively infinite ($10^{12}$ to $10^{15}$ program/erase cycles) write and erase endurance of RAM with the non-volatile long term data retention of a non-volatile memory. Such a memory device could be utilized by system designers to supplement or even entirely replace both RAM and ROM/Flash/non-volatile memory in computer systems and in portable devices.

For the reasons stated above, and for other reasons stated below which will become apparent to those skilled in the art upon reading and understanding the present specification, there is a need in the art for methods and apparatus for a non-volatile memory cell that allows for a non-volatile memory with high speed write/read/erase access, low voltage program and erase, low power usage, device feature scalability and effectively infinite endurance.

DETAILED DESCRIPTION

Figure 1A:
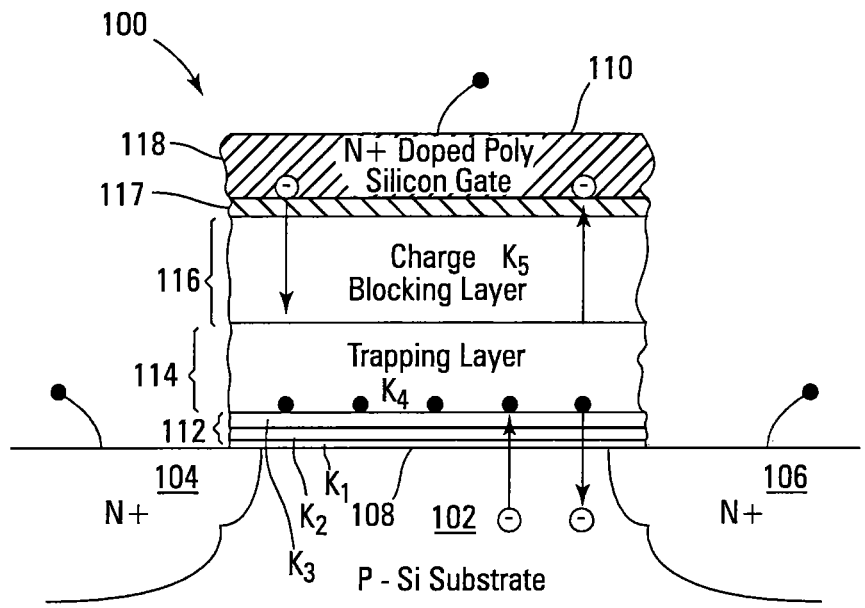
FIGS. 1A and 1B detail a normal mode memory cell and band diagram in accordance with embodiments of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the claims and equivalents thereof.

Non-volatile memory devices and arrays, in accordance with embodiments of the present invention, facilitate the utilization of band-gap engineered gate stacks with asymmetric tunnel barriers in floating node memory cells. These asymmetric tunnel barrier floating node memory cells allow for low voltage direct tunneling programming and erase in NOR or NAND architecture memories. The asymmetric band-gap gate memory cell stack also contains high charge blocking barriers and deep carrier trapping sites for good charge retention. This allows memory device embodiments of the present invention to operate with the characteristics of an ideal or universal memory device. The low voltage direct tunnel program and erase capability also reduces damage to the gate stack and the crystal lattice from high energy carriers, reducing write fatigue and leakage issues and enhancing device lifespan allowing effective infinite endurance ($10^{12}$ to $10^{15}$ program/erase cycles). The low voltage program and erase of embodiments of the present invention also allow for low voltage memory array design and a smaller effective oxide thickness (EOT) of the memory cell gate-stacks, allowing low power, voltage scaling, and for an overall memory array die area reduction and enabling further scaling of device features as process technology improves. Reverse and normal mode memory cell embodiments of the present invention are detailed. Other memory cell embodiments of the present invention allow multiple levels of bit storage in a single memory cell. Embodiments of the present invention arranged in NOR or NAND memory architectures are provided.

For a non-volatile memory to fulfill the role of both RAM and ROM in a system as a universal memory device, it should overcome the current limitations of non-volatile memory of limited write/erase endurance, high operating voltages, high power requirements, and limited access speeds. To do this the non-volatile memory should generally fulfill the following requirements: no more than 2× to 3× supply/logic operating voltage for conducting its read, write, or erase operations; have an effectively infinite endurance ($10^{12}$ to $10^{15}$ program/erase cycles); have a limited power draw, such that it can be powered off batteries in portable devices; have a high access speed (in the range of nanoseconds to be similar to RAM access) for read and write operations; and retain stored data for 10 or more years (as currently is the standard for non-volatile memory devices). It is noted that such an ideal non-volatile memory would also benefit from lower internal operating voltages, currently and in the future, by not being limited in device feature scaling and overall design architecture due to high voltage considerations. In addition, it is noted that if a non-volatile memory, such as an embodiment of the present invention, comes close to these requirements for a universal memory device for speed of access, system architecture and design in many cases can be modified to still allow it to be used as a universal memory. Such architecture and design changes will be apparent to those skilled in the art with the benefit of the present disclosure and include, but are not limited to, multi-level memory architectures, memory system read and write caching, on-chip write caching, and memory interleaving.

As stated above, current non-volatile memory devices, due to their operating characteristics, generally cannot act as a universal memory and fulfill the role of both RAM and ROM in a computer system or portable device. Most current non-volatile memory devices require that a 10V to 20V of voltage be supplied or internally generated for programming and/or erase operations, which typically occur utilizing CHE, hot hole, or Fowler-Nordheim tunneling. Because of this high voltage requirement (5× to 10× or more of the currently common supply voltages/logic levels of 1.8V to 2.5V) the power requirements of the devices is quite high during a programming or erase operation. In addition, if high voltage is not externally supplied, the internal generation of high voltages (via internal supply circuits such as charge pumps) is itself inefficient and power consuming.

The high programming and erase voltages required by the current generation of non-volatile memory devices also dictates that channel widths and the effective oxide thickness of the individual memory cells be relatively large in order to be able to withstand the high fields generated by these voltages. This increases the size of the resulting memory array and limits the amount of scaling that can be done due to integrated circuit processing improvement. In addition, the support circuitry of the non-volatile memory device must also be designed to accommodate the elevated voltages. The increased oxide thicknesses, device separation requirements, scaling limitations, isolation wells, high voltage circuit designs and other circuit accommodations due to high voltage use typically increases the size of the resulting memory device layout by as much as 40% to 50% in current non-volatile memory devices. Furthermore, due to the large EOT of the memory cells, internal voltage generation, high voltage support circuitry designs and other characteristics of the current generation of non-volatile memory devices, access speeds are generally quite slow compared to RAM devices. In particular, write and erase operations are typically executed in milliseconds to microseconds, instead of the nanosecond execution of a write operation in a DRAM. As also detailed above, the high amount of leakage current generated by and materials damage done to the memory cells and other devices of the current generation of non-volatile memory devices by the required high voltages, fields, and high energy carriers also generally limits the endurance of the overall non-volatile memory device and its expected useful lifetime (typically $10^6$ program/erase cycles in current non-volatile memory devices).

As stated above, conventional floating gate memory cells of the prior art are typically Field Effect Transistor (FET) devices. These devices are typically formed as three terminal devices having a source, drain and control gate connections. In a typical floating gate memory cell, source and drain regions of an opposite impurity doping are formed in an impurity doped silicon substrate and are separated by a channel region (a typical NFET transistor would have N+ doped source/drain regions in a P doped substrate, a PFET transistor would have P+ source/drains in a N doped substrate). The gate stack of the floating gate or floating node memory cell is typically formed over the channel region and/or portions of the source and drain regions and typically comprises successive layers of tunnel insulation, a floating gate or floating node, a charge blocking insulation layer and the control gate. The gate stack allows the formation of minority carriers in the channel and control of the carrier flow from the source to the drain through the channel via the voltage applied to the control gate. The floating gate or floating node is typically formed of a conductive material (such as polysilicon as a floating gate) or a non-conductive charge trapping layer (such as nitride as a floating node) and is electrically isolated between tunnel and charge blocking insulation layers. The control gate is typically formed of aluminum, tungsten, iridium, polysilicon, or other conductive material. A conductive underlayer may optionally be applied before depositing the control gate, which acts as a chemical passivation layer. This passivation layer typically consists of a thin film of TaN, TiN, HfN, or $IrO_2$.

The electrical structure of a FET is that of a capacitor if viewed from between the channel and the control gate. If sufficient voltage is applied across the control gate and the channel will form a channel of carriers and the FET will conduct current from its source to drain region. In a floating gate memory cell FET, the electrical structure formed between the channel, floating gate and control gate is equivalent to that of two series coupled capacitors. Because of this, charge placed/trapped on the floating gate by moving carriers through the insulation layers (via charge injection or tunneling) alters the effective threshold voltage (Vth) of the floating gate memory cell FET (the voltage applied across the control gate and the channel at which a channel of carriers is formed in the channel region and the FET begins to conduct current from its source to drain region). This ability to alter the threshold voltage by trapping or removing charge from the floating gate allows data values to be stored in the floating gate memory cell and read by sensing the differing current flows through the memory cell FET from its source to drain in its programmed and unprogrammed states. The floating node memory cell FET operates similar to the floating gate memory cell FET, except that the charges are stored in a non-conductive trapping layer replacing the floating gate. It is noted that some floating node memory cells with non-conductive trapping layer, such as NROM, allow the storage of more than one bit of data in a memory cell by trapping carriers locally near and/or above each source/drain region, allowing the differing bits of data to be read by switching which source/drain region is electrically used as the source or drain.

The insulation layers of conventional floating gate memory cell FETs must have sufficient charge blocking ability for the memory cell to allow for required charge retention period (typically set at a 50% to 75% amount of the originally stored charge retained after a 10 year time period). In conventional floating gate memory cells, this is accomplished by forming the insulator layers (also known as oxide layers due to the most common forms of insulator materials utilized) of materials with sufficient thickness and high enough conduction bands to be effective tunnel barriers, preventing leakage and back-tunneling of the trapped charge. Conventional flash memory cell devices typically utilize a relatively thick $SiO_2$ tunnel insulator layer oxide and a stack of oxide-nitride-oxide (ONO) as a charge blocking layer medium between the control gate and the floating gate. The typical effective oxide thickness (EOT) of the entire gate-stack (which affects the capacitive characteristics of the floating gate/node FET) for these conventional flash memory cells generally range from 150 nm to 200 nm in thickness. If these insulation layers of a floating gate memory cell are too thin or are formed of materials that do not have a sufficiently high conduction band, the trapped charge will leak out of the device from the floating gate or floating node through leakage current or via direct tunneling. As this leakage current increases, the floating gate device acts less and less as a non-volatile memory and more like a volatile memory device (such as DRAM) in that it must be periodically refreshed or its stored charge data contents will dissipate and be lost.

Because of these high insulator thicknesses and tunnel barriers, the effective oxide thickness (EOT) of the FET from the control gate to the channel is relatively high and therefore the voltages that must be utilized in programming and/or erasing conventional floating gate memory cells (12V to 20V for the current 90-100 nm feature size of integrated circuit process technology) are typically significantly higher than the supply voltages of the device (1.2V to 5V). As a result, such high voltage must therefore be internally generated with charge pump circuits or separately supplied from a special external source. This use of such relatively high voltage requires specialized design and layout, which, as stated above, can increase the size of the resulting memory by as much as 40% to 50% and can significantly impact the memory device's cost of fabrication. Furthermore, this use of high voltage can increase the energy utilized in erase and program significantly, and therefore increases the power requirements of the memory device. The high voltage requirements, as also detailed above, can also increase damage to the material of the insulator layers, leading to increased charge leakage and a shorter useful life (a smaller number of overall program/erase cycles) for the memory device. In addition, the relatively high fields generated by these high programming and erase voltage places limits on any future feature reductions for the part as manufacturing processes improve.

As stated above, another type of non-volatile memory cell consists of a floating node field effect transistor (FET), whereby charge is stored in local defect sites called traps characteristic of the material properties of a thin layer of dielectric that is incorporated as a part of the gate-insulator stack of the FET. These types of devices are classified as embedded trap devices, in contrast to the floating or embedded gate devices mentioned earlier. Embedded trap devices, in general, require lower programming voltages and exhibit somewhat higher programming speed and endurance due to the lower effective oxide thickness (EOT) of the gate insulator stack employed and the differing materials utilized in their construction.

A first common type of embedded trap device, which is widely utilized in many current memory devices, uses a trapping insulator where the charges are stored both at the interface and in the bulk of the trapping insulator. This kind of device usually employs a silicon (substrate)-oxide-nitrideoxide-silicon (gate) or "SONOS" gate-stack, wherein the nitride is the trapping insulator. A more recently developed second type of embedded trap device is known as a "nano-crystal" or "nano-dot" embedded trap device. In this type, silicon, germanium, or metal crystals or dots are embedded in the insulator layer (such as $SiO_2$ or other dielectric), replacing the nitride. Defects or traps associated with the nano-crystals become centers of charge storage in these types of devices.

In both of the above described embedded trap devices, the effective oxide thickness (EOT) of the gate insulator stack can be reduced to nearly half that of the minimum EOT of a conventional floating gate type of device. Consequently, the programming voltages of embedded trap device can be reduced by nearly a factor of two (2×) compared to that of a conventional floating gate memory cell. As a result of this, embedded trap devices are generally considered to be more scalable with the development of improved integrated processing techniques. This improvement is true irrespective of the charge injection mechanism being utilized, CHE or Fowler-Nordheim tunneling. However, the high carrier energy associated with the above charge injection mechanisms still limit the reliability and endurance of such devices in a similar manner (although at a reduced level) to that of a conventional floating gate memory cell device.

The conventional floating gate and embedded trap memory cells and devices discussed above involve high energy ("hot") charge transport between the substrate and the floating gate for programming and erasure, known as channel hot electron (CHE) or hot hole injection. In CHE/hot hole programming and erasure, the field placed across the control gate and the channel is high enough to inject carriers (holes/electrons) to or from the channel to the floating gate or trapping layer across the tunnel insulator layer. Part of the energy of the hot carriers is transferred to the interface lattice between the silicon substrate and the gate oxide. As a result, interface bonds break and interface characteristics get degraded after multiple write-erase cycles. Consequently, the hot charge transport generates surface states at the silicon-oxide interface and creates local weak spots in the gate oxide that negatively affects the device by degrading the FET transconductance (Gm), enhancing the stored charge loss from the floating gate (i.e. retention loss), and reducing the endurance (i.e. operable write-erase cycles) of the device.

Programming and erasure by Fowler-Nordheim tunneling operates by field enhanced quantum mechanical tunneling of the carriers through the conduction barriers of the insulator layers to place or remove the carriers to or from the floating gate/trapping layer of the memory cell. As a result, Fowler-Nordheim tunneling takes place at reduced fields and voltages than CHE or hot hole injection. However, as an elevated voltage is required to boost the electrical field to the levels needed to induce tunneling, the energy acquired by the carriers is still high and can induce damage of the device materials, reducing memory cell endurance and the effective device lifetimes. In particular, Fowler-Nordheim tunneling can generate fixed charge centers in the tunneling insulators and shallow traps and defects in the trapping layer, thus breaking stable bonds and eventually degrading the dielectric properties of the insulators of the device. Due to the high voltages and currents required, power consumption during programming and erasure is also still significant factor in Fowler-Nordheim tunneling devices.

As stated above, both the high voltage requirements and higher leakage currents associated with the current generation of flash technology have begun to adversely affect endurance, reliability, power and speed of operation of the resulting devices. The high programming and erase voltages create high fields across the gate insulator stack resulting in gate insulator oxide degradation. This gate insulator oxide degradation impacts device non-volatility (retention) reliability and limits the overall device endurance. The high fields also severely limit the amount the device feature geometry can shrink beyond the current generation. The high programming voltages are also known to induce a strong capacitive cross-coupling between a selected bit and adjacent unselected bits with the same wordline (or bitline) or between adjacent wordlines or bitlines. This cross-coupling has become a critical issue in the overall memory device speed and scaling. Cross-coupling issues typically increase as voltage levels are increased or the memory device features are scaled smaller without a commensurate reduction in voltage levels.

In conventional SONOS type Flash memory cell devices or for Flash memory cell devices using nano-crystal traps, the tunnel oxide thickness can generally be reduced to around 4 nm and EOT of the charge blocking oxide/NO layer to around 5-6 nm while still ensuring approximately 10 years of charge retention at 85V° C. (assuming sufficient fraction of original trapped charge, typically 50% to 75%, retained at the end-of-life such that the logic level may be appropriately sensed). This sets an overall minimum gate stack EOT of approximately 10 nm and, consequently, a programming voltage level of approximately 10 volts at the low end for such devices, assuming a reasonable programming speed in the range of 100 μsec to 1 msec. For the above tunnel oxide thickness, electron transport during the programming typically takes place via Fowler-Nordheim tunneling. However, to meet the programming speed, the initial electron current density typically must exceed 1E-3 $A/cm^2$, requiring a field across the tunnel oxide exceeding 10E6 V/cm, limiting the amount of programming voltage reduction realistically possible. The above oxide thicknesses typically will also allow reverse leakage current for the stored electrons of <1E-12 $A/cm^2$, which allows the resulting devices to meet the requirement of 10 years of charge retention at 85V° C.

If the tunnel oxide thickness in a conventional floating gate or floating node memory cell is scaled below 3.2 nm, transport takes place via direct tunneling. Unlike transport by Fowler-Nordheim tunneling, wherein electrons need to acquire sufficient energy to exceed the energy barrier (typically 3.2 eV for SONOS devices), direct tunneling is exponentially dependent on the tunneling distance and takes place at significantly lower electron energy. Therefore, electron current density can be many orders of magnitude higher while at low voltages when the tunnel oxide is very thin (e.g., 1 nm-1.5 nm). Consequently, both programming speed could be enhanced as well as programming power significantly reduced if electron transport could take place by direct tunneling. However, as stated above, for very thin tunnel oxide the reverse leakage is also very high as the likelihood of back-tunneling is also typically increased by the thin oxides. As such, the retention of such pure direct tunneling devices fails to meet non-volatility requirements of holding the stored charge for any significant time duration, meaning that the device has failed and may not be considered an operative non-volatile memory device (without employing frequent refreshing of the memory states).

Because of the above stated reasons, oxide-based non-volatile memory cell devices, such as traditional Flash, SONOS, or Nano-crystal memory cells are limited in voltage, power and speed scalability. Additionally, because of the high fields required across the oxide insulation layers, such oxide-based devices are also limited in reliability and endurance.

Generally, to meet universal memory device operating characteristics, non-volatile memory cells devices must program and erase at a fast access speed at acceptably low voltage and power, while concurrently exhibiting long retention, enhanced endurance and reliability. In order to do this they typically must satisfy the following requirements:

1) The EOT of the entire gate insulator stack should be in the range of 2 nm to 6 nm for low voltage operation and speed.
2) The maximum average initial programming field should be =<7.5E6 V/cm.
3) The electron current density during programming should be >>1E-3 A/cm$^2$.
4) The electron leakage current density during retention should be <1E-12 A/cm$^2$.
5) The electron trap density should be >5E12/cm$^2$ to facilitate a desired Vt shift for minimum adequate logical state separation.

To meet these requirements, embodiments of the present invention utilize band-gap engineered gate-stacks that allow low voltage program and erase of the memory cells via the direct tunneling of carriers to or from the trapping layer. The band-gap engineered gate stack of the present invention incorporate asymmetric tunnel barriers having multiple layers of direct tunnel layers of increasing conduction band offset and increasing values of K (dielectric constant) to provide very high electron current density during programming at reduced voltage drop across the direct tunnel layers, fulfilling requirements 2) and 3) stated above. The combination of deep charge trapping centers and asymmetric tunnel barriers of increasing band offset provides large reverse tunneling barrier to promote the required charge retention, thereby fulfilling requirement 4) above. Appropriate selections of charge trapping material and embedded nanocrystals enable fulfillment of requirement 5) while the dielectric constant values of the entire gate stack layers help fulfill requirement 1).

As stated above, in direct tunneling of carriers, the carriers are quantum mechanically tunneled into the floating gate/trapping layer under low energy conditions. To overcome limitations of reverse direct tunneling operation, the gate-stack of the embodiments of the present invention utilizes multiple layers of material that are band-gap engineered with increasing band-gap offsets and high K values to form an asymmetric band-gap tunnel insulator layer. This asymmetric band-gap tunnel insulator layer is very efficient in charge transport in one direction and yet becomes very retarded in the reverse transport direction, presenting a large barrier. The asymmetric band-gap tunnel insulator layer allows for a low voltage direct tunneling to the trapping layer of the device when a programming field is applied across it utilizing the stepped internal fields of the band-gaps of the asymmetric band-gap tunnel insulator layers, while the same stepped band-gap offsets and high K dielectrics present a large band-gap and consequently large energy barrier to the charges so trapped to prevent back-tunneling and maintain the required long term charge retention.

Because of this direct tunneling programming and erasure, embodiments of the present invention provide a non-volatile memory cell having an insulator stack with a low overall EOT, allowing them to be operated at very low power and at low programming voltage. The low voltage program and/or erase operations of embodiments of the present invention also reduce damage in the material of the device due to the tunneling/injection of carriers through the insulator layers (the injected carriers are "cool" and never gain enough energy to affect the lattice or material bonds). In addition, embodiments of the present invention allow for improved scaling by allowing the memory to employ smaller effective oxide thicknesses (EOT) and low voltage layout and design in the array and support circuitry of the resulting memory device.

The band-gap engineered tunneling medium of embodiments of the present invention consists of multiple layers of direct tunnel layers of increasing conduction band offset (each following tunnel layer has a higher conduction band energy level than the previous layer) and increasing values of K (dielectric constant) to provide very high electron current density during programming at reduced voltage drop across the direct tunnel layers, allowing for high speed, low power programming.

For a conventionally structured normal mode memory cell (a normal gate-insulator stack or NGIS) the charge blocking layer and tunnel layer placement are positioned in the gate-insulator stack, such that the charge blocking layer is between the control gate and the floating node and the tunnel insulator is between the channel and the floating node. In this arrangement, charge transport takes place primarily between the channel and the trapping layer (floating node) during programming and erasure. In operation, the stepped band-gap arrangement facilitates direct tunneling of electrons layer to layer from the channel to the trapping layer with a low applied field. After tunneling to the trapping layer, the combined asymmetric stepped energy barriers, long back tunnel distance, and optional deep level charge traps act to reduce charge leakage to the substrate and provide adequate charge retention for non-volatile usage. A high K charge blocking layer and passivation layer are also integrated in the gate-stack for such embodiment of the present invention to maintain low charge leakage to the control gate from the trapping layer.

In another embodiment of the present invention, nano-crystals are embedded in a trapping layer which contains deep high density traps to provide a large trapped charge density, enhancing logic level separation and increasing stored charge, while minimizing the adverse effects of coulomb blockade and quantum confinement. The use of deep traps and/or nano-crystals further increase charge retention by providing deep quantum wells at the trapping layer, further increasing the potential barrier that the trapped charges must overcome to escape from the trapping layer or back-tunnel through.

Programming the above normal mode memory cell embodiments of the present invention is accomplished by providing a voltage across the channel and the control gate to apply a field across the multiple tunnel layers and induce direct tunneling of electrons from the channel to the trapping layer. In multi-bit storage, the voltage is applied between a selected source/drain region (with memory cell FET operating with the selected source/drain region acting as a source and the second source/drain region acting as the drain) and the control gate, tunneling electrons to the trapping layer directly adjacent to the selected source/drain region. The memory cell is then read by reversing the operational function of the first and second source/drain regions (the selected source/drain region acting as the drain and the second source/drain region acting as the source).

Erasure in the above normal mode embodiments of the present invention is also accomplished by direct tunneling. Although the erase operation is also by direct tunneling, the energy barriers are successively higher due to the asymmetric stepped barriers present in the tunnel layers, resulting in a relatively slower erase speed when compared to the write operation. An elevated negative voltage is applied across the channel and the control gate, applying a field across the multiple tunnel layer and inducing direct tunneling of electrons from the trapping layer to the channel to erase the memory cell. As stated above, it is noted that this direct tunneling erase is typically slower in operation than the direct tunnel program operation due to having to tunnel through the entire combined thickness and barrier of the asymmetric band-gap tunnel insulator. Higher voltages can also be applied to speed the erase operation, however, this will have the effect of increasing device structure damage. At the same time, the asymmetric barrier significantly improves the charge retention, since trapped electrons cannot assume enough energy to get into the conduction band when the memory cell is in the standby state. The relatively slower erase, however, can be offset by utilization of a block erase operation, where a large block of bits is erased in parallel.

Although the low voltage direct tunneling erase is in a relatively slower speed than the direct tunnel programming due to the asymmetric band-gap tunnel insulator, it is noted that non-volatile device erasure is typically infrequent and, in block erase based devices, can be done on a parallel basis, as stated above. It is also noted that memory cell erasure of embodiments of the present invention can also be accomplished by conventional hot-hole injection, Fowler-Nordheim tunneling, or by enhanced tunneling of holes from the control gate.

It is also noted that the appropriate selection of gate passivation layers as well as band engineered tunnel layers can be utilized to enhance erase speed through simultaneous hole injection from the control gate during erase operation. In this form of erasure, a band-gap engineered charge blocking insulation layer is formed between the control gate and the trapping layer, which allows for efficient and enhanced tunneling of holes from the control gate to the trapping layer at an appropriate control gate voltage level. At the above voltage level, an effective field is established across the charge blocking layer, between the electrons trapped in the charged trapping layer to the control gate, such that holes (which have a higher effective mass than electrons) are efficiently tunneled across the charge blocking layer. As more and more trapped electrons are compensated from the trapping layer by hole tunneling and trapping, the effective field between the control gate and the trapping layer across the charge blocking layer diminishes until the trapping layer is discharged or compensated (at this point, a balanced steady state of hole tunneling from the control gate and electron tunneling from the channel to the trapping layer is established). As a result of this balanced steady state, memory cell erasure is self-limiting and the possibility of memory cell overerasure diminished. Such method of memory cell erasure through hole injection is detailed in U.S. Pat. No. 7,279,740, titled "BAND-ENGINEERED MULTI-GATED NON-VOLATILE MEMORY DEVICE WITH ENHANCED ATTRIBUTES," issued Oct. 9, 2007 and U.S. Pat. No. 6,784,480, titled "ASYMMETRIC BAND-GAP ENGINEERED NONVOLATILE MEMORY DEVICE," issued Aug. 31, 2004, both of which are commonly assigned.

For the reverse mode memory cell (a reverse gate-insulator stack or RGIS) the charge blocking layer and tunnel layer placement are reversed in the gate-insulator stack, such that the charge blocking layer is now between the channel and the floating node and the tunnel insulator is between the control gate and the floating node. In this arrangement, charge transport takes place primarily between the control gate and the trapping layer (floating node) during programming and erasure. Programming such a reverse mode memory cell is accomplished by providing a voltage to the substrate while the control gate of the cell to be programmed is held to a low or ground potential Enhanced electron injection from the control gate, increased transport through the direct tunnel layers due to increasing conduction band offset and increasing K values, and subsequent trapping in the deep trapping centers in the trapping layer fulfills the programming requirements. As a result, the threshold of the programmed cell is raised and data is stored. Reading is accomplished in a similar manner as a normal mode memory cell.

For the reverse mode memory cell, erasure is accomplished by imposing an appropriate positive potential at the control gate while the substrate is held at a low (even to a slightly negative) or ground potential. During erasure, the electrons from the trapping layer returns to the control gate by direct tunneling. Block erasure offsets somewhat reduced erase speed similar to the normal mode memory cell device. Reading of the erased state is accomplished in a similar manner as carried out in the normal mode device.

Reverse mode memory cells have an advantage over normal mode memory cells in that both the program and erase operations can be accomplished with positive voltages only, thereby simplifying support circuitry. In addition, appropriate selection of channel passivation layers (such as $SiO_2$ and oxygen-rich SiON of refractive index $\gamma=1.5$ which can be utilized to saturate the dangling bonds of the silicon substrate) between the channel and the charge blocking layer as well as band engineered charge blocking layers can be utilized to enhance erase speed through simultaneous hole injection from the channel during erase operation.

Although much of the focus of the embodiment is primarily on the normal mode memory cell, it should be noted that the reverse mode memory cell equally embraces the underlying concepts of the invention towards providing a universal memory device. Furthermore, in actual implementation, the reverse mode memory cell may exhibit certain advantages in speed-power-density tradeoffs over normal mode memory cells.

This programming and erasure by the transport of electrons by direct tunneling allows embodiments of the present invention to consume orders of magnitude lower power compared to conventional flash memory cells and devices. Writing speed is significantly enhanced as electrons tunnel directly from one direct tunnel layer into the next through successive layers of low barrier energy.

As stated above, the tunnel insulation layer region of embodiments of the present invention consists of two or more layers of dielectric material with increasing conduction band offsets and/or increasing dielectric K values, allowing directionally asymmetric direct tunneling efficiency of carriers through the tunnel layer. The layers of dielectric material can be selected from any commonly utilized insulator materials (oxides, mixed oxides, nitrides, oxynitrides, mixed oxynitrides, or silicates) so long as they are arranged in increasing band-gap offsets and, preferably, higher K dielectric materials to help reduce the EOT of the resulting memory cell. Examples of these insulator materials include, but are not limited to, silicon dioxide ($SiO_2$), titanium dioxide ($TiO_2$), hafnium oxide ($HfO_2$), zirconium oxide, Praseodymium Oxide ($Pr_2O_3$), alumina ($Al_2O_3$), mixed oxide hafnium and aluminum, mixed oxide of hafnium and titanium, mixed oxide of hafniumn and silicon, silicon oxynitride (SiON), SiN, AlN, HfN, mixed oxynitrides of hafnium and silicon, etc. These layers of increasing band-gap offset dielectric material are typically deposited over the channel region of the memory cell during manufacturing processing utilizing atomic layer deposition (ALD) or other appropriate deposition processes.

For example, the tunnel region may be a composite of one or more mono layers of $SiO_2$ (band gap 9 eV, K=3.9), ALD grown on silicon substrate, followed by a one or more mono-layers of silicon nitride (SiN, band offset 1.03 eV, K=7) or alumina ($Al_2O_3$, band offset: 4.5 eV, K=10) to be followed by a one or more mono-layers of $HfO_2$ (band offset: 1.65 eV, K=24) or $Pr_2O_3$ (band offset: 1.9 eV; band gap 3.9 eV; K=30) or $TiO_2$ (band offset 3.15 eV; K=60) for a three layer tunnel layer structure. A two-layer tunnel structure can consist of $SiO_2/Pr_2O_3$ or $SiO_2/TiO_2$, $SiO_2/HfO_2$, etc. It is noted that other two, three, or more layer asymmetric band-gap tunnel regions of embodiments of the present invention are also possible and will be apparent to those skilled in the art with the benefit of the present disclosure, and as such the above examples should not be considered as limiting.

It is also noted that, in one embodiment of the present invention, the successive layers of the asymmetric band-gap tunnel layer not only have increasing band offsets, but also have material of higher K values and increased direct tunnel thickness to minimize the effective EOT of the tunnel layer composite and optimize voltage drop across the each of the tunnel layers. In embodiments of the present invention, the physical thickness of the composite tunnel layer can be preferably designed to be around 3 nm or less and the EOT around 1.5 nm or less for low voltage operation. For example, a typical tunnel layer may consist of 0.8 nm of $SiO_2$+1 nm of SiN+1 nm of $HfO_2$ (EOT=1.6 nm) or 0.8 nm of $SiO_2$+1 nm of $HfO_2$+1.5 nm of $Pr_2O_3$ (EOT32 1.3 nm) or 0.8 nm of $SiO_2$+1 nm of $HfO_2$+2 nm of $TiO_2$ (EOT~=1.2 nm).

In order to improve retention and charge density, metal nano-crystal memory devices have been utilized that contain certain metal or semiconductor nano-dots or nano-crystals including, but not limited to, tungsten, silicon, germanium, cobalt, platinum, gold, iridium, and palladium to provide deep energy trapping sites at the metal-insulator interface due to large work function difference. However, such devices require optimum dot size and dot separation to facilitate effective retention of trapped charges due to quantum confinement effect (to prevent electrons from tunneling between adjacent trapping sites within the trapping layer or tunneling back to silicon). In addition, coulomb blockade (where like charges repel each other) could further degrade charge retention, necessitating that multiple charge trapping per nano-dot should be avoided.

If coulomb blockade is minimized such that effectively a single electron is captured for every available nano-dot trapping site and the nano-dot size and separation are optimized to reduce the adverse effects of quantum confinement, the effective charge trapping density of nano-dot trapping layer is limited to around $1E12/cm^2$ to $2E12/cm^2$ regardless of the actual density of nano-dots. Consequently, the effective charge trapping density for conventional nano-dot or nano-crystal devices is limited. This effective charge trapping density limitation can be overcome if an optimum geometry and distribution of nano-crystals were embedded in insulating trapping layers that also contained a high density of naturally occurring deep traps, such as SiN, AlN, $Ta_2O_5$, $TiO_2$, or SiON. If this trapping layer is also formed of high K material, the EOT of the entire stack would also be reduced.

The above concept is utilized for the trapping medium in one embodiment of the invention. In this approach, the trapping medium may consist of an appropriate thickness of an insulator having a large number of naturally occurring trap sites, such as silicon oxynitride (SiON, trap depth: Et>1.2 eV, refractive index ~1.8, K=7) or $HfO_2$ (trap depth: Et=1.5 eV, K=24), silicon nitride ($Si_3N_4$, trap depth: Et=1.0 eV, refractive index=2.0, K=7), silicon-rich silicon nitride, tantalum oxide, ($Ta_2O_5$, Et=2.7 eV, K=26) aluminum nitride (AlN, trap depth>1.0 eV, K=10) or $TiO_2$ (trap depth: Et=0.9 eV, K=60). The trapping medium is then embedded with nano-crystals/nano-dots that can include, but are not limited to tungsten, silicon, germanium, cobalt, platinum, iridium, gold, or palladium in sizes ranging from 1.5 nm to 4 nm with a separation of 3.5 nm to 5 nm to further increase the number of trapping sites.

As stated above, the silicon oxy-nitride (SiON) utilized in the above example provides additional charge trapping sites. The nitrogen-rich SiON has an atomic silicon concentration of approximately 38%-40%, an atomic oxygen concentration of approximately 20%, and an atomic nitrogen concentration of approximately 40%, resulting in a trapping layer with a dielectric constant of approximately 7, refractive index of approximately γ=1.8 and a charge trap density of 8E12-1E13/cm2. In the above SiON, deep energy traps are associated with larger concentrations of Si—O—N bond "defects" in the silicon oxy-nitrides. Such a trapping layer of an embodiment of the present invention would provide an effective charge density in the desired range of $5E \; 12/cm^2$ to $1E13/cm^2$ without the adverse effects on retention due to coulomb blockade or quantum confinement. It is noted that other charge trapping insulator materials may also be utilized in embodiments of the present invention as the charge trapping layer.

For one embodiment of the present invention, the charge blocking layers are preferably comprised of a single or composite layer of large K dielectric material layers such as $Al_2O_3$ (K=10) or $Pr_2O_3$ (K=30) or $TiO_2$ (K=60) of thickness greater than 6 nm, to provide a large electron energy barrier and prevent direct tunneling of trapped charges to the control gate while helping minimize the overall EOT of the gate-stacks. As stated above, charge blocking layers have been disclosed that allow for erasure of the data stored in the trapped charge on the trapping layer or floating gate of the memory cell by allowing the tunneling or injection of hole or electron carriers through the charge blocking layer from the control gate. It is noted, however, that multiple insulators can be utilized in charge blocking layers of embodiments of the present invention, including, but not limited to insulators from the oxide, mixed oxide, nitride, oxynitrides, mixed oxynitrides, and silicate families.

For the reverse mode device, similar concepts apply for the charge blocking layer which is deposited on top of the silicon substrate. To passivate the silicon-gate insulator interface, one to three mono-layers of $SiO_2$ or SiON may be employed before a high K charge blocking layer (e.g., $Al_2O_3$ or $Pr_2O_3$) is deposited. Such interface has the added advantage of providing a fixed negative charge to reduce electron injection from the substrate during programming and erase.

The control gate of embodiments of the present invention typically consist of a thin passivating conductive underlayer of HfN, TiN, $IrO_2$ or TaN (for process integration) with either a polysilicon gate or any other appropriate metal gate (such as aluminum, iridium, or tungsten) formed over it.

The total EOT for a gate stack of an embodiment of the present invention made with the above materials and specifications will typically range from EOT=2.5 nm to EOT=6.5 nm with physical thickness ranging (excluding gate electrode thickness) from 10 nm and upward, have a programming voltage as low as 1.5V, and an average field as low as $1.0E6V/cm^2$. This allows memory cells and devices of embodiments of the present invention to provide voltage scalability and low power consumption levels not available in other current memory devices.

Figure 1B:
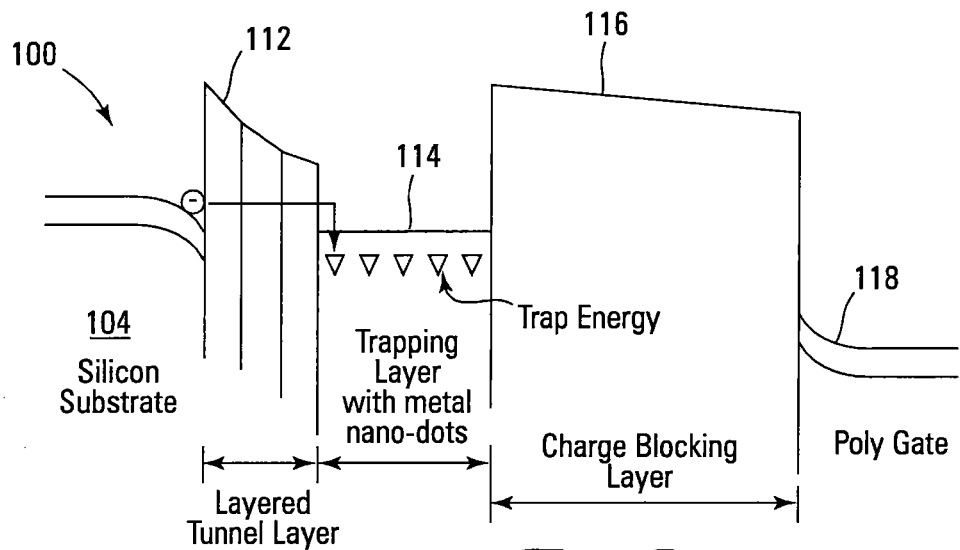

For the normal mode device, FIG. 1A details physical cross section of the gate stack structure and FIG. 1B details the corresponding band-gap diagram of a normal mode memory cell 100 in accordance with embodiments of the present invention. In FIG. 1A, a NFET memory cell 100 is shown formed on a substrate 102. The memory cell 100 has a first and second source/drain regions 104, 106, in contact with a channel region 108, and a gate-stack 110 formed over the channel region 108. The gate-stack 110 contains a tunnel insulator layer 112 formed over the channel region 108, a trapping layer/floating node 114 formed over the tunnel insulator layer 112, a charge blocking layer 116 formed over the trapping layer 114, an optional passivation layer 117, and a control gate 118. The tunnel insulator layer 112 includes two or more layers of materials layered to provide an asymmetric stepped band-gap profile. Other normal mode memory cell embodiments of the present invention may also provide a trapping layer 114 with deep traps and embedded metal nano-crystals, and a high K charge blocking layer 116.

Specifically, in one embodiment, the tunnel insulator layer 112 contains three layers of material, a first layer of 0.5 nm of $SiO_2$ (K=4), having a band-gap of approximately 9 eV formed over the channel region 108 and silicon substrate 102, which has a band-gap of 1.1 eV. A second layer of 1 nm of SiN (band offset 1.03 eV, K=7) or $Al_2O_3$, (band gap: 8.8 eV, K=10) is formed over the first layer of $SiO_2$. And a third layer of 1 nm of $HfO_2$ (band-gap: 4.5 eV, K=24) is formed over the second layer.

The trapping layer 114 is formed of a layer of 5-7 nm of $TiO_2$ (band-gap of approximately 3.15 eV, K=60) with 3.5-4.0 nm of embedded Cobalt nano-dots, having a resulting EOT of nearly 0.3 nm. Alternatively, the trapping layer could be a single layer of aluminum nitride (AlN, K=15) or nitrogen-rich SiON (of refractive index of approximately γ=1.8 and K=7) of appropriate thickness containing deep traps (Et>1.0 eV). The charge blocking layer 116 is formed of 10 nm of $Al_2O_3$, (band gap: 8.8 eV, K=10), $Pr_2O_3$ (band gap: 3.9 eV, K=30), $TiO_2$ (band gap: 3.15 eV, K=60) with an EOT as low as 0.67 nm. The control gate 118 is then typically formed of polysilicon, tungsten, iridium, or aluminum and may include an initial passivation layer 117, such as a thin layer of HfN, TaN, $IrO_2$ or TiN, formed over the charge blocking layer 116.

In another embodiment, the tunnel insulator layer 112 also contains three layers of material, a first layer of 0.5 nm of $SiO_2$ (K=4), having a band-gap of approximately 9 eV formed over the channel region 108 and silicon substrate 102, which has a band-gap of 1.1 eV. A second layer of 1 nm of SiN (band offset 1.03 eV, K=7) or oxygen-rich silicon oxy-nitride, SiON, (refractive index of approximately γ=1.55, band-gap 7.3 eV, and K=5) or $Al_2O_3$, (band gap: 8.8 eV, K=10) formed over the first layer of $SiO_2$. And a third layer of 1.5 nm of $HfO_2$ (band-gap: 4.5 eV, K=24) formed over the second layer. The effective oxide thickness (EOT) of these three layers could be as low as 1.32 nm. The oxygen-rich silicon oxy-nitride (SiON, with refractive index of approximately γ=1.55) has an atomic oxygen concentration of >=46%, while its atomic silicon concentration is <=33%. The corresponding nitrogen-rich silicon oxy-nitride (SiON, with a refractive index of approximately γ=1.8) has an atomic oxygen concentration of <=25%, while the atomic nitrogen concentration is approximately 40%.

The trapping layer 114 is formed of a layer of 6 nm of $HfO_2$ with 3.5-4.0 nm of embedded Cobalt nano-dots, having a resulting EOT of 0.3 nm. The charge blocking layer 116 is formed of 10 nm of $TiO_2$ (K=60) with an EOT of 0.67 nm. And the gate electrode 118 formed of 10 nm of TiN as a passivation layer 117 and doped polysilicon.

Total combined EOT of the gate-stack 110 for the above example can be as low as 2.3 nm and the total physical insulator thickness is 19 nm Such a device would yield the following characteristics: programming voltage +/−1.5V; voltage coupling to tunnel layer: 0.86V (coupling coefficient: 0.574); trap density: >$5E12/cm^2$; Logic Separation: >0.5V (100 electron trapping/storage) per device. Average programming/erase electric field: <$1E6V/cm^2$.

It is noted, as detailed above, that multiple insulators can be utilized in tunnel layers of embodiments of the present invention, including, but not limited to insulators from the oxide, mixed oxide, nitride, oxynitride, mixed oxynitride, and silicate families.

Figure 1C:
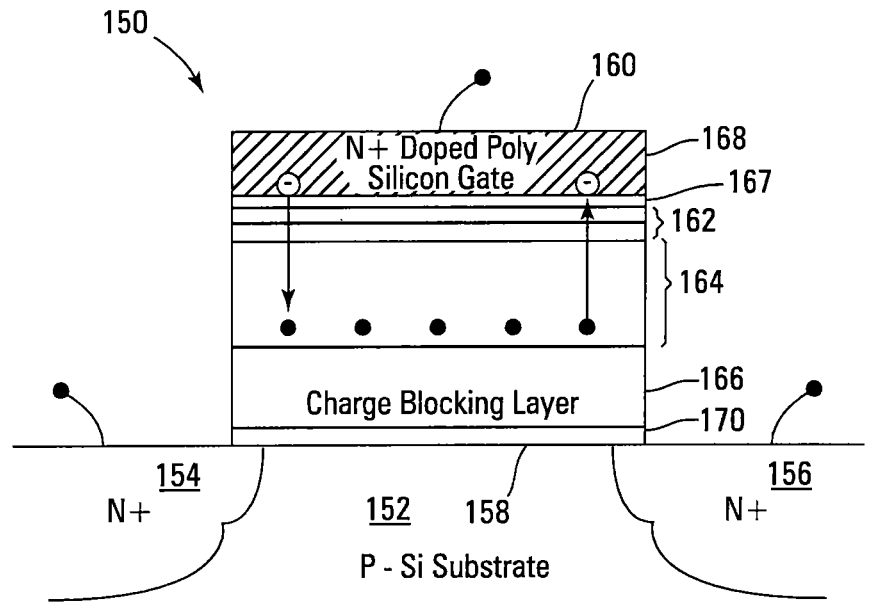
FIGS. 1C and 1D detail a reverse mode memory cell and band diagram in accordance with embodiments of the present invention.
Figure 1D:
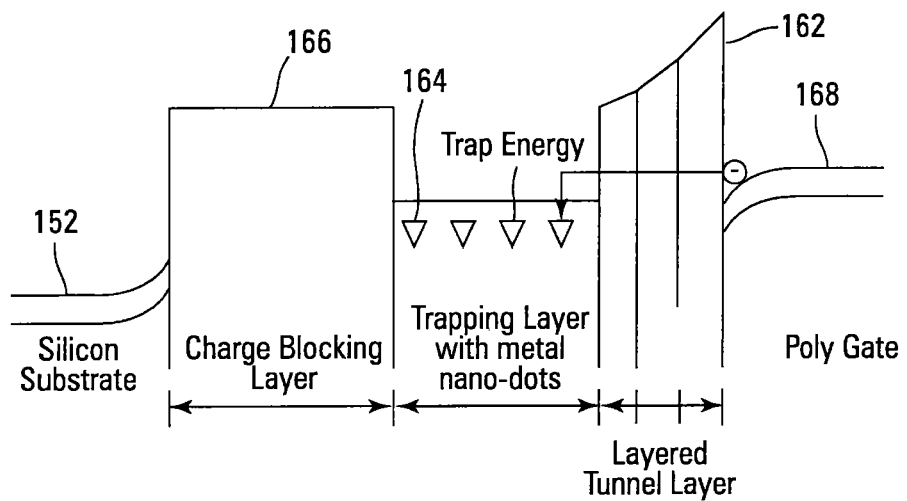

For the reverse mode device, FIG. 1C details physical cross section of the gate stack structure and FIG. 1D details the corresponding band-gap diagram of a reverse mode memory cell 150 in accordance with embodiments of the present invention. In FIG. 1C, a reverse mode NFET memory cell 150 is shown formed on a substrate 152. The memory cell 150 has a first and second source/drain regions 154, 156, in contact with a channel region 158, and a gate-stack 160 formed over the channel region 158. The gate-stack 160 contains a charge blocking layer 166 formed over the channel region 158, a trapping layer/floating node 164 formed over the charge blocking layer 166, a tunnel insulator layer 162 formed over the trapping layer 164, and a control gate 168 formed over the tunnel insulator layer 162. An optional passivation layer 167 is formed between the tunnel insulator layer 162 and the control gate 168. Another optional passivation layer 170 such as $SiO_2$ or oxygen-rich SiON that reduces interface states can be formed between the channel region 158 and the charge blocking layer 166. The tunnel insulator layer 162 includes two or more layers of materials layered to provide an asymmetric stepped band-gap profile. Other reverse mode memory cell embodiments of the present invention may also provide a trapping layer 164 that contains deep traps and embedded metal nano-crystals, and a high K charge blocking layer 166.

Figure 2:
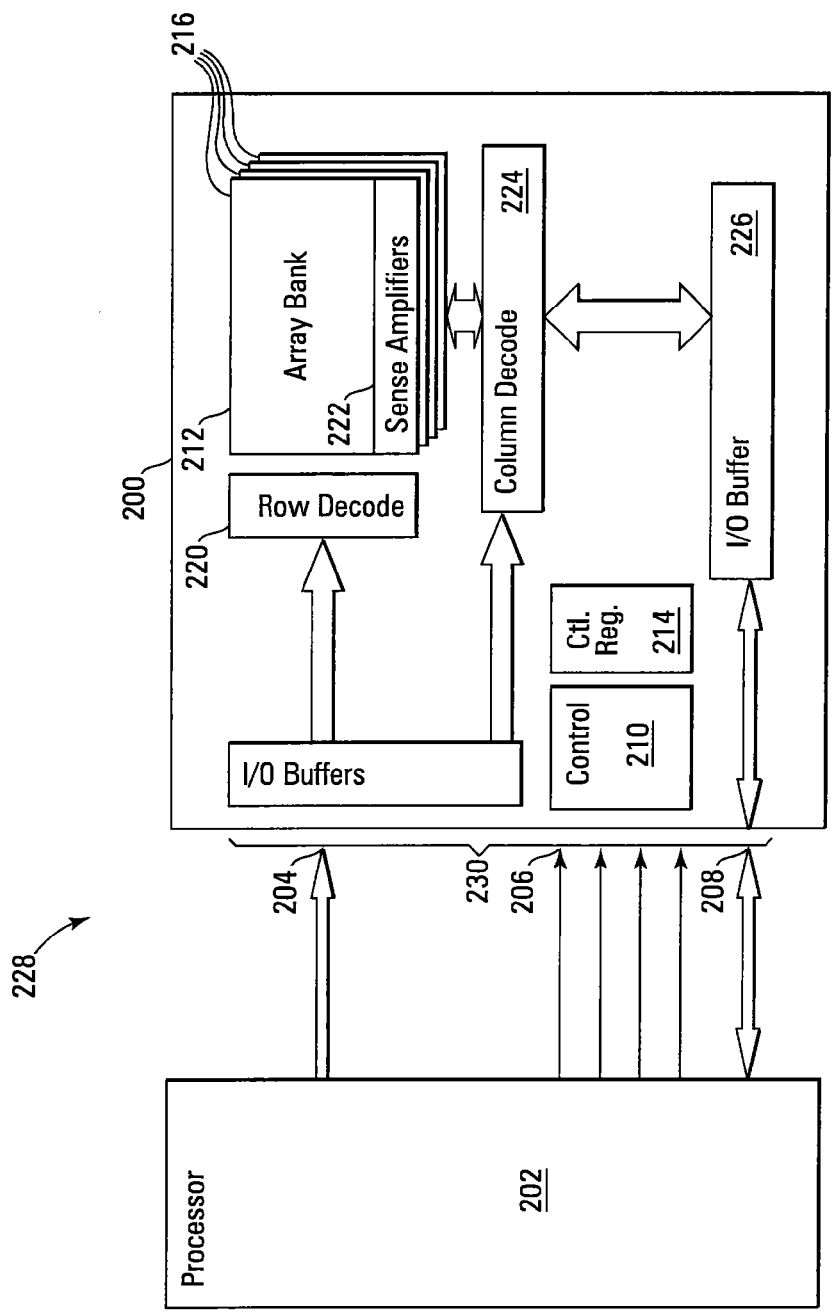
FIG. 2 details a system with a memory device in accordance with embodiments of the present invention.

FIG. 2 shows a simplified diagram of a system 228 incorporating a non-volatile memory device 200 of the present invention coupled to a host 202, which is typically a processing device or memory controller. In one embodiment of the present invention, the non-volatile memory 200 is a NOR architecture Flash memory device or a NAND architecture Flash memory device. The non-volatile memory device 200 has an interface 230 that contains an address interface 204, control interface 206, and data interface 208 that are each coupled to the processing device 202 to allow memory read and write accesses. It is noted that other memory interfaces 230 that can be utilized with embodiments of the present invention exist, such as a combined address/data bus, and will be apparent to those skilled in the art with the benefit of the present disclosure. In one embodiment of the present invention, the interface 230 is a synchronous memory interface, such as a SDRAM or DDR-SDRAM interface. Internal to the non-volatile memory device, an internal memory controller 210 directs the internal operation; managing the non-volatile memory array 212 and updating RAM control registers and non-volatile erase block management registers 214. The RAM control registers and tables 214 are utilized by the internal memory controller 210 during operation of the non-volatile memory device 200. The non-volatile memory array 212 contains a sequence of memory banks or segments 216. Each bank 216 is organized logically into a series of erase blocks (not shown). Memory access addresses are received on the address interface 204 of the non-volatile memory device 200 and divided into a row and column address portions. In one embodiment of the present invention, the non-volatile memory 200 is utilized by the host 202 as a universal or ideal memory, replacing both the RAM and ROM in the system 228.

On a read access the row address is latched and decoded by row decode circuit 220, which selects and activates a row/page (not shown) of memory cells across a selected memory bank. The bit values encoded in the output of the selected row of memory cells are coupled to a local bit line (not shown) and a global bit line (not shown) and are detected by sense amplifiers 222 associated with the memory bank. The column address of the access is latched and decoded by the column decode circuit 224. The output of the column decode circuit 224 selects the desired column data from the internal data bus (not shown) that is coupled to the outputs of the individual read sense amplifiers 222 and couples them to an I/O buffer 226 for transfer from the memory device 200 through the data interface 208.

On a write access the row decode circuit 220 selects the row page and column decode circuit 224 selects write sense amplifiers 222. Data values to be written are coupled from the I/O buffer 226 via the internal data bus to the write sense amplifiers 222 selected by the column decode circuit 224 and written to the selected non-volatile memory cells (not shown) of the memory array 212. The written cells are then reselected by the row and column decode circuits 220, 224 and sense amplifiers 222 so that they can be read to verify that the correct values have been programmed into the selected memory cells.

As previously stated, the two common types of EEPROM and Flash memory array architectures are the "NAND" and "NOR" architectures, so called for the similarity each basic memory cell configuration has to the corresponding logic gate design. In the NOR array architecture, the floating gate memory cells of the memory array are arranged in a matrix similar to RAM or ROM. The gates of each floating gate memory cell of the array matrix are coupled by rows to word select lines (word lines) and their drains are coupled to column bit lines. The source of each floating gate memory cell is typically coupled to a common source line. The NOR architecture floating gate memory array is accessed by a row decoder activating a row of floating gate memory cells by selecting the word line coupled to their gates. The row of selected memory cells then place their stored data values on the column bit lines by flowing a differing current from the coupled source line to the coupled column bit lines depending on their programmed states. A column page of bit lines is selected and sensed, and individual data words are selected from the sensed data words from the column page and communicated from the memory.

An EEPROM or Flash NAND array architecture also arranges its array of floating gate memory cells in a matrix such that the gates of each floating gate memory cell of the array are coupled by rows to word lines. However each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

A NAND architecture floating gate memory array is accessed by a row decoder activating a row of floating gate memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Figure 3A:
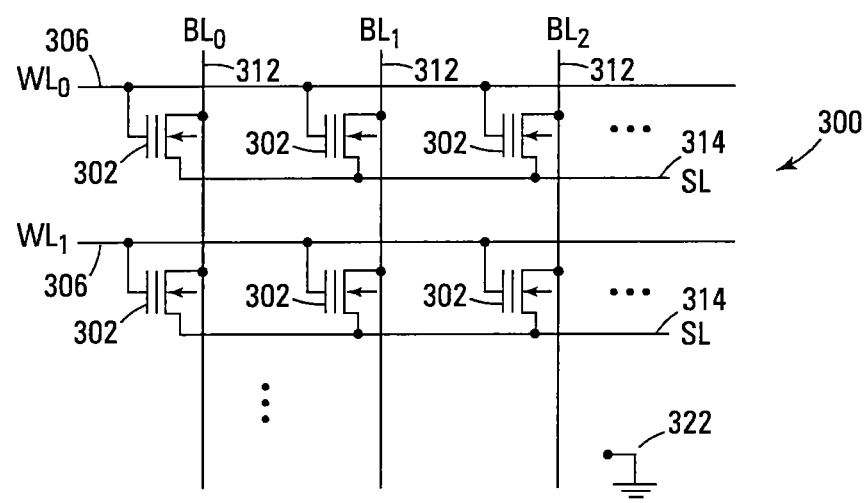
FIGS. 3A and 3B detail NOR and NAND architecture memory arrays in accordance with embodiments of the present invention.

FIG. 3A shows a simplified NOR floating gate or trapping layer memory array 300 of a EEPROM or Flash memory device of an embodiment of the present invention. In FIG. 3A, a NOR array 300 couples floating gate or trapping layer memory cells 302 of embodiments of the present invention to bit lines 312, source lines 314, word lines 306, and a substrate connection 222. In forming the NOR array 300, the bit lines 312 and source lines 314 are typically formed locally from N+ doped regions deposited in the substrate and are separated by a channel region. Each memory cell FET 302 has a gate-insulator stack formed over the channel region and between the N+ doped regions of a bit line 312 and a source line 314, utilizing the N+ doped regions as a drain and source respectively (it is noted that the source line 314 may be replaced with a second bit line 312 connection in multi-bit cell arrays, so that the current flow through the memory cell may be reversed). As described above, the gate-insulator stack is made of a composite asymmetric band-gap tunnel insulator layer formed on top of the channel region, a floating gate/trapping layer formed on the tunnel insulator, charge blocking insulator layer formed over the trapping layer, and a control gate 306 (typically formed integral to the word line 306, also known as a control gate line) formed over the charge blocking insulator. It is noted that other NOR architecture memory array 300 configurations incorporating embodiments of the present invention are possible and will be apparent to those skilled in the art with the benefit of the present disclosure.

Figure 3B:
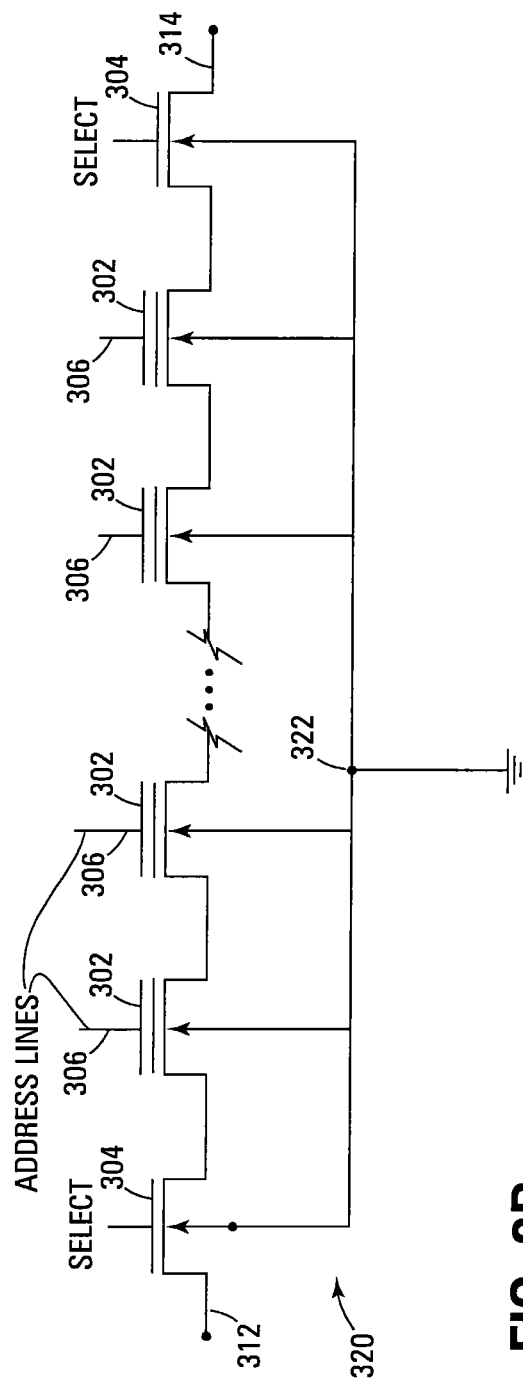

FIG. 3B details a simplified NAND memory string 320 of a NAND architecture EEPROM or Flash memory device of an embodiment of the present invention. In FIG. 3B, a series of floating gate or trapping layer memory cells 302 of embodiments of the present invention are coupled together source to drain to form a NAND string 320 (typically of 8, 16, 32, or more cells). Each memory cell FET 302 has a gate-insulator stack that is made of a composite asymmetric band-gap tunnel insulator layer on top of the substrate, a floating gate/trapping layer formed on the tunnel insulator layer, charge blocking insulator layer formed over the trapping layer, and a control gate 306 (typically formed in a control gate line, also known as a word line) formed over the charge blocking layer. N+ doped regions are formed between each gate insulator stack to form the source and drain regions of the adjacent floating gate memory cells, which additionally operate as connectors to couple the cells of the NAND string 320 together. Optional select gates 304, that are coupled to gate select lines, are formed at either end of the NAND floating gate string 320 and selectively couple opposite ends of the NAND floating gate string 320 to a bit line 312 and a source line 314. In a NAND memory array, the NAND architecture memory string 320 of FIG. 3B would be coupled to bit lines 312, source lines 314, word lines 306, and a substrate connection 322.

It is also noted that other memory cells, memory strings, arrays, and memory devices in accordance with embodiments of the present invention are possible and should be apparent to those skilled in the art with benefit of the present disclosure.

CONCLUSION

Non-volatile memory devices and arrays have been described that utilize asymmetric band-gap engineered gate stacks with asymmetric tunnel barriers in floating gate memory cells in NOR or NAND memory architectures that allow for direct tunnel programming and erase, while maintaining high charge blocking barriers and deep carrier trapping sites for good charge retention. The low voltage direct tunneling program and erase capability reduces damage to the gate stack and the crystal lattice from high energy carriers, reducing write fatigue and leakage issues and enhancing device lifespan. The low voltage program and erase also allow for low voltage memory array design and a smaller effective oxide thickness (EOT) of the memory cell gate-stacks, allowing for an overall memory array die area reduction and enabling further scaling of device features as process technology improves. Reverse and normal mode memory cell embodiments of the present invention are detailed. Memory cell embodiments of the present invention also allow multiple bit storage in a single memory cell, and allow for programming and erase with reduced voltages. These characteristics allow memory device embodiments of the present invention to operate within the definition of an ideal or universal memory device, capable of replacing both DRAM and ROM in a system.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of forming a reverse mode non-volatile memory cell structure, comprising:
    forming a first and second source/drain regions on a substrate, the first and second source/drain regions defining an intervening channel region;
    forming a charge blocking layer over the channel region;
    forming a trapping layer over the charge blocking layer;
    forming a tunnel insulator layer of two sub-layers over the trapping layer, wherein the two sub-layers comprise layers of increasing conduction band offset; and
    forming a control gate over the tunnel insulator layer;
    wherein a first and second sub-layers of the two sub-layers are one of $SiO_2$ and $Pr_2O_3$, $SiO_2$ and $TiO_2$, and $SiO_2$ and $HfO_2$.

2. The method of claim 1, further comprising:
    wherein forming a tunnel insulator layer of two sub-layers over the trapping layer further comprises forming a tunnel insulator layer having an effective oxide thickness of 1.5 nm or less.

3. A method of forming a reverse mode non-volatile memory cell structure, comprising:
    forming a first and second source/drain regions on a substrate, the first and second source/drain regions defining an intervening channel region;
    forming a charge blocking layer over the channel region;
    forming a trapping layer over the charge blocking layer;
    forming a tunnel insulator layer of three sub-layers over the trapping layer, wherein the three sub-layers comprise layers of increasing conduction band offset; and
    forming a control gate over the tunnel insulator layer;
    wherein a first, second, and third sub-layers of the three sub-layers are one of $SiO_2$, SiN, and $HfO_2$; $SiO_2$, $HfO_2$, and $Pr_2O_3$; $SiO_2$, $HfO_2$, and $TiO_2$; $SiO_2$, oxygen-rich SiON (refractive index of approximately 1.5), and $HfO_2$; and $SiO_2$, $Al_2O_3$, and $HfO_2$.

4. The method of claim 3, wherein forming a trapping layer further comprises forming one of a floating gate, a floating node, and an embedded trapping layer.

5. The method of claim 4, wherein forming a trapping layer further comprises forming charge trapping deep potential wells.

6. The method of claim 4, wherein forming a trapping layer further comprises forming a trapping layer of one of oxygen-rich silicon oxy-nitride (SiON), nitrogen-rich silicon oxy-nitride (SiON), aluminum nitride (AlN), silicon nitride (SiN), silicon-rich nitride (SRN), hafnium oxide ($HfO_2$), tantalum oxide ($Ta_2O_5$), and titanium oxide ($TiO_2$).

7. The method of claim 3, wherein forming a charge blocking layer further comprises forming a charge blocking layer of one or more sub-layers of high K dielectric.

8. The method of claim 3, further comprising:
    wherein forming a tunnel insulator layer of three sub-layers over the trapping layer further comprises forming a tunnel insulator layer having an effective oxide thickness of 1.5 nm or less.

9. A method of forming a reverse mode non-volatile memory cell structure, comprising:
    forming a first and second source/drain regions on a substrate, the first and second source/drain regions defining an intervening channel region;
    forming a charge blocking layer of one or more sub-layers of high K dielectric over the channel region;
    forming a trapping layer over the charge blocking layer;
    forming a tunnel insulator layer of two or more sub-layers over the trapping layer, wherein the two or more sub-layers comprise layers of increasing conduction band offset; and
    forming a control gate over the tunnel insulator layer;
    wherein forming a charge blocking layer of one or more sub-layers of high K dielectric further comprises forming the one or more sub-layers of one of hafnium oxide ($HfO_2$), alumina ($Al_2O_3$), praseodymium oxide ($Pr_2O_3$), and titanium oxide ($TiO_2$).

10. The method of claim 9, further comprising forming a N− or P− doped channel region.

11. The method of claim 9, further comprising:
    wherein forming a tunnel insulator layer of two or more sub-layers over the trapping layer further comprises forming a tunnel insulator layer having an effective oxide thickness of 1.5 nm or less.

12. A method of forming a reverse mode non-volatile memory cell structure, comprising:
    forming a charge blocking layer over a channel region;
    forming a trapping layer over the charge blocking layer;
    forming a tunnel insulator layer of two sub-layers over the trapping layer, wherein the two sub-layers comprise layers of increasing conduction band offset; and
    forming a control gate over the tunnel insulator layer;
    wherein a first and second sub-layers of the two sub-layers are one of $SiO_2$ and $Pr_2O_3$, $SiO_2$ and $TiO_2$, and $SiO_2$ and $HfO_2$.

13. The method of claim 12, wherein forming a trapping layer further comprises forming one of a floating gate, a floating node, and an embedded trapping layer.

14. The method of claim 13, wherein forming a trapping layer further comprises forming a trapping layer of one of oxygen-rich silicon oxy-nitride (SiON), nitrogen-rich silicon oxy-nitride (SiON), aluminum nitride (AlN), silicon nitride (SiN), silicon-rich nitride (SRN), hafnium oxide ($HfO_2$), tantalum oxide ($Ta_2O_5$), and titanium oxide ($TiO_2$).

15. The method of claim 12, further comprising:
wherein forming a tunnel insulator layer of two sub-layers over the trapping layer further comprises forming a tunnel insulator layer having an effective oxide thickness of 1.5 nm or less.

16. The method of claim 15, further comprising:
wherein forming a charge blocking layer over a channel region, forming a trapping layer over the charge blocking layer, and forming a tunnel insulator layer of two sub-layers over the trapping layer further comprises forming the charge blocking layer, the trapping layer and the tunnel insulator layer to have a total effective oxide thickness of 2.3 nm to 6.5 nm.

17. A method of forming a reverse mode non-volatile memory cell structure, comprising:
forming a charge blocking layer over a channel region;
forming a trapping layer over the charge blocking layer;
forming a tunnel insulator layer of three sub-layers over the trapping layer, wherein the three sub-layers comprise layers of increasing conduction band offset; and
forming a control gate over the tunnel insulator layer;
wherein a first, second, and third sub-layers of the three sub-layers are one of $SiO_2$, SiN, and $HfO_2$; $SiO_2$, $HfO_2$, and $Pr_2O_3$; $SiO_2$, $HfO_2$, and $TiO_2$; $SiO_2$, oxygen-rich SiON (refractive index of approximately 1.5), and $HfO_2$; and $SiO_2$, $Al_2O_3$, and $HfO_2$.

18. The method of claim 17, further comprising:
wherein forming a tunnel insulator layer of three sub-layers over the trapping layer further comprises forming a tunnel insulator layer having an effective oxide thickness of 1.5 nm or less.

19. The method of claim 18, further comprising:
wherein forming a charge blocking layer over a channel region, forming a trapping layer over the charge blocking layer, and forming a tunnel insulator layer of three sub-layers over the trapping layer further comprises forming the charge blocking layer, the trapping layer and the tunnel insulator layer to have a total effective oxide thickness of 2.3 nm to 6.5 nm.

* * * * *

UNITED STATES PATENT AND TRADEMARK OFFICE
CERTIFICATE OF CORRECTION

PATENT NO. : 8,802,526 B2  
APPLICATION NO. : 13/409832  
DATED : August 12, 2014  
INVENTOR(S) : Arup Bhattacharyya Page 1 of 1

It is certified that error appears in the above-identified patent and that said Letters Patent is hereby corrected as shown below:

In the Claims

Column 20, line 16, in Claim 6, delete "(AIN)," and insert -- (AlN), --, therefor.

Signed and Sealed this
Eleventh Day of November, 2014

Michelle K. Lee
*Deputy Director of the United States Patent and Trademark Office*